United States Patent [19]

Kanabara

[11] Patent Number: 5,278,790
[45] Date of Patent: Jan. 11, 1994

[54] MEMORY DEVICE COMPRISING THIN FILM MEMORY TRANSISTORS

[75] Inventor: Minoru Kanabara, Hachioji, Japan

[73] Assignee: Casio Computer Co., Ltd., Tokyo, Japan

[21] Appl. No.: 710,057

[22] Filed: Jun. 4, 1991

Related U.S. Application Data

[63] Continuation-in-part of Ser. No. 517,352, May 1, 1990, Pat. No. 5,036,231.

[30] Foreign Application Priority Data

May 15, 1989 [JP] Japan .................................. 1-120749
Oct. 31, 1990 [JP] Japan .................................. 2-292145

[51] Int. Cl.$^5$ ......................... G11C 11/00; G11C 8/00
[52] U.S. Cl. ........................... 365/189.05; 365/230.06; 365/235
[58] Field of Search ...................... 365/189.05, 230.06, 365/235, 239, 168; 257/66

[56] References Cited

U.S. PATENT DOCUMENTS

| | | | |
|---|---|---|---|
| 4,410,965 | 10/1983 | Moore | 365/230 |
| 4,811,294 | 3/1989 | Kobayashi et al. | 365/189.01 |
| 4,899,316 | 2/1990 | Nagami | 365/189.01 |
| 4,953,127 | 8/1990 | Nagahashi et al. | 365/189.05 |
| 5,010,522 | 4/1991 | Ashmore, Jr. | 365/189.07 |
| 5,027,326 | 6/1991 | Jones | 365/221 |
| 5,034,922 | 7/1991 | Burgess | 365/189.05 |
| 5,134,581 | 7/1992 | Ishibashi et al. | 365/181 |

Primary Examiner—William L. Sikes
Assistant Examiner—Terry D. Cunningham
Attorney, Agent, or Firm—Frishauf, Holtz, Goodman & Woodward

[57] ABSTRACT

A latch circuit is provided between a column switch connected to the input/output sides for selecting data lines and a tristate buffer connected to the write side of a memory array, or between the column switch and a sense amplifier connected to the readout side of the memory array. The latch circuit has a capacity corresponding to a plurality of data contents in the tristate buffer or the sense amplifier. While data set in a portion of the latch circuit is being output, the next data can be set in another portion of the latch circuit.

9 Claims, 13 Drawing Sheets

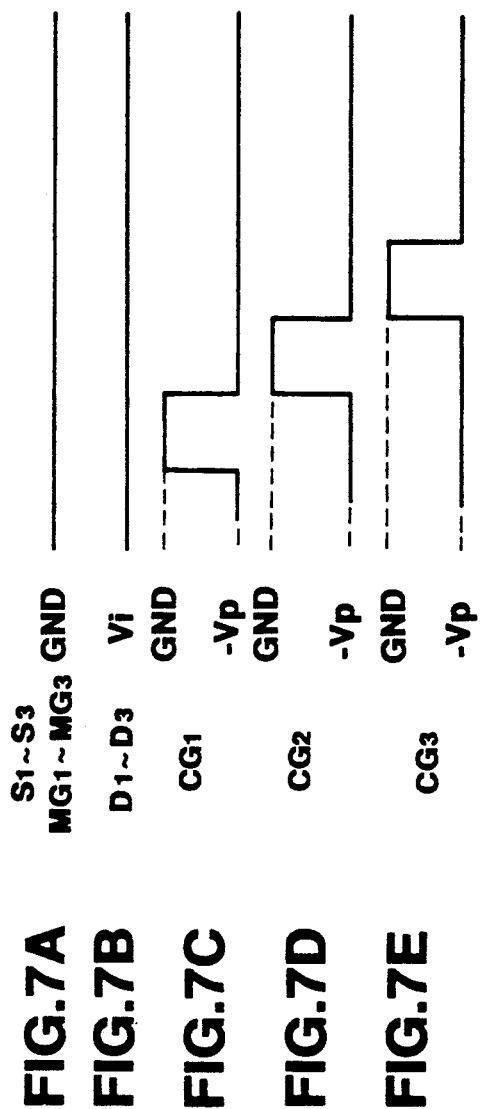

| Enable | IN | OUT |
|--------|----|----|
| 0 | 0 | 1 |
| 0 | 1 | 0 |
| 1 | 0 | 0 |
| 1 | 1 | 1 |

| A | Enable | B | C | T40 | T41 | X |
|---|--------|---|---|-----|-----|---|
| 0 | 0 | 0 | 1 | OFF | ON | 0 |
| 1 | 0 | 1 | 0 | ON | OFF | 1 |
| 0 | 1 | 0 | 0 | OFF | OFF | H·Z |
| 1 | 1 | 0 | 0 | OFF | OFF | H·Z |

| Enable | INPUT | OUTPUT | ACTIVE CIRCUIT |
|---|---|---|---|
| 0 | A0 | B0 | $C_{10}$ |
| 1 | B0 | A0 | $C_{20}$ |

FIG.13

$C_{10}$ ACTIVE

| Enable | A0(INPUT) | B0(OUTPUT) |
|---|---|---|
| 0 | 0 | 0 |
| 0 | 1 | 1 |

FIG.14

$C_{20}$ ACTIVE

| Enable | B0(INPUT) | A0(OUTPUT) |
|---|---|---|
| 1 | 0 | 0 |
| 1 | 1 | 1 |

FIG.15

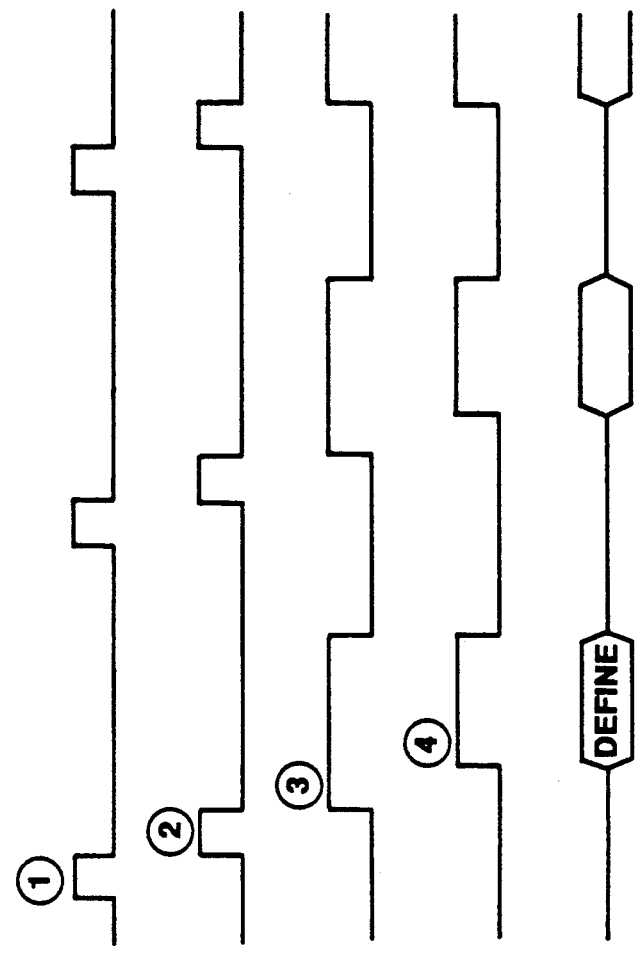

MEMORY DEVICE COMPRISING THIN FILM MEMORY TRANSISTORS

CROSS-REFERENCE TO THE RELATED APPLICATIONS

This application is a continuation-in-part of application Ser. No. 517,352, filed on May 1, 1990, now U.S. Pat. No. 5,036,231, issued Jul. 20, 1991.

BACKGROUND OF THE INVENTION

1. Field of the Invention

The present invention relates to a memory system which can have a large area and enables high-speed read/write operations to be performed.

2. Description of the Related Art

Recently, a thin-film transistor memory which can be formed on an insulative substrate such as a glass substrate has been developed. Examples of such a thin-film transistor memory are shown in U.S. patent application Ser. Nos. 07/427,041, 07/427,252 and 07/467,736 filed by the same applicant as the present application. This type of memory can be used as an electrically programmable non-volatile memory. Compared to a conventional MNOS (metal-nitride-oxide semiconductor) type memory or a floating-gate type EEPROM (electrically erasable programmable read-only memory), the manufacture of the thin-film transistor memory is easier and the area of this memory can be increased.

However, the thin-film transistor memory has such a problem that the access speed of this memory is lower than that of a widely used DRAM, etc.

SUMMARY OF THE INVENTION

The object of the present invention is to provide a memory system wherein the apparent write/read speed of a memory array is increased, thereby decreasing the write/read time.

According to an aspect of the present invention, in order to achieve this object, there is provided a memory system comprising:

a memory array having a plurality of row lines;

row line designating means for designating a predetermined one of the row lines of the memory array, for effecting data readout and data write;

sense amplifier means for discriminating data read out from the memory array;

latch means for latching data corresponding to at least two rows of the memory array;

a data line for transferring data to be written in the memory array or data read out from the memory array; and read/write means including write means for dividing the data supplied from the data line into a plurality of units and successively supplying the units of data to the latch means, and for supplying the data as a batch, which is latched in the latch means and corresponds to one row, to the memory array, and readout means for supplying the data as a batch, which has been read out from the memory array via the sense amplifier means and corresponds to one row, to the latch means, and for dividing the data of one row latched in the latch means into a plurality of units and successively supplying the units of data to the data line.

By virtue of this structure, the apparent write/read speed of a memory array is increased, thereby decreasing the write/read time.

BRIEF DESCRIPTION OF THE DRAWINGS

FIGS. 1 through 19 illustrate an embodiment of the present invention, in which:

FIG. 1 is a view for describing the structure of a memory drive apparatus;

FIG. 2 shows a schematic circuit of a portion of a memory array shown in FIG. 1;

FIG. 3 is a cross-sectional view showing a detailed structure of a memory element used in the memory array shown in FIG. 2;

FIG. 4 is a graph showing a VG-ID characteristic of a thin-film transistor memory shown in FIG. 2;

FIGS. 7A to 7E are timing charts showing driving voltage waveforms in the data read mode in FIG. 2;

FIG. 8 shows a circuit structure of a portion of the buffer shown in FIG. 1;

FIG. 9 is a view for explaining the operation of the circuit shown in FIG. 8;

FIG. 10 shows a circuit structure of a portion of the tristate buffer shown in FIG. 1;

FIG. 11 is a view for explaining the operation of the circuit shown in FIG. 10;

FIG. 12 is a circuit diagram showing a portion of the I/0 buffer shown in FIG. 1;

FIGS. 13 to 15 are views for explaining the operation of a portion of the buffer shown in FIG. 12;

FIG. 16 is a circuit diagram showing a portion of the sense amplifier shown in FIG. 1;

FIGS. 17A to 17E are timing charts for explaining the operation of the circuit shown in FIG. 16;

FIG. 19 is a circuit diagram showing the column switch shown in FIG. 1.

DETAILED DESCRIPTION OF THE PREFERRED EMBODIMENTS

Figure 1:
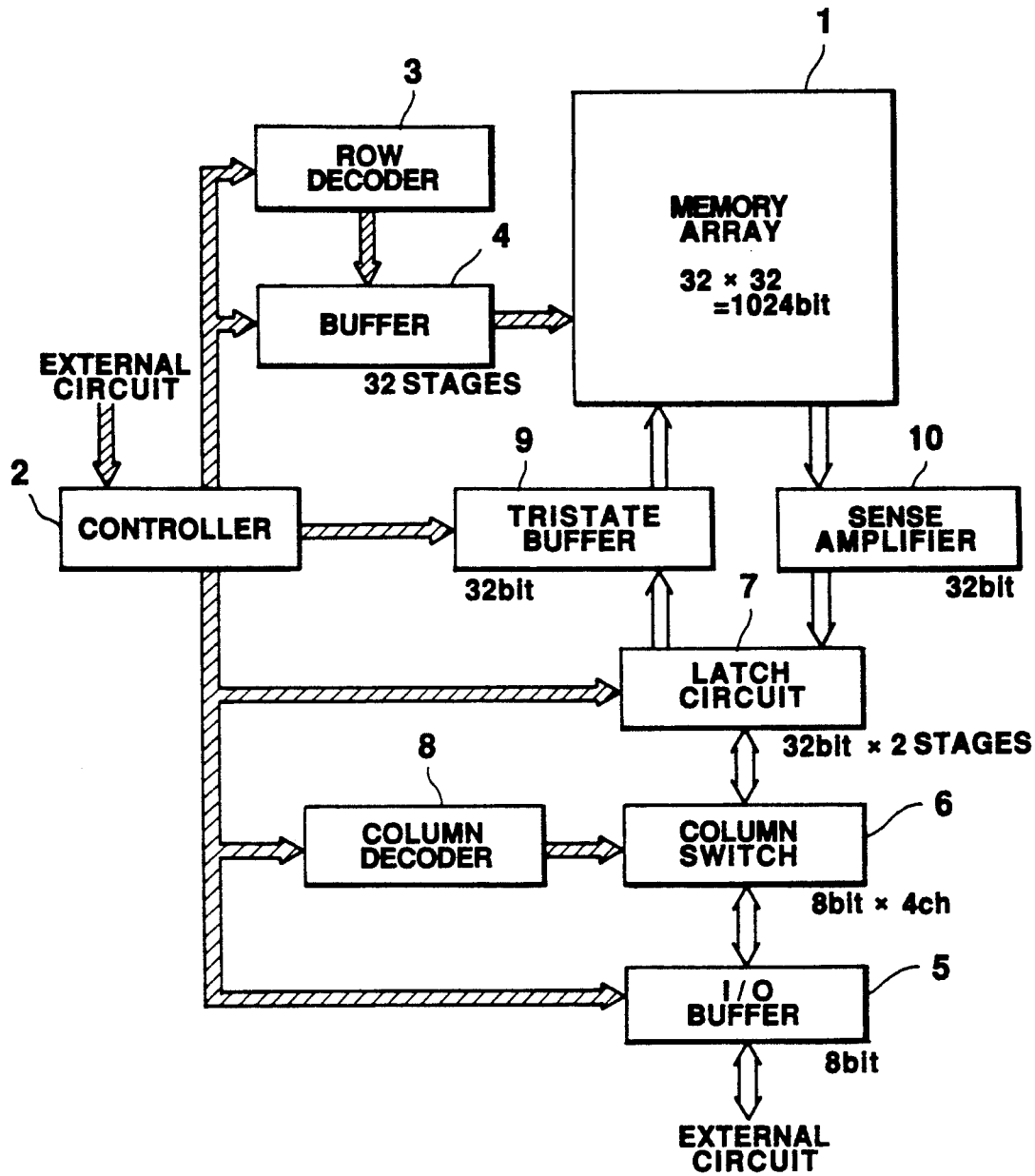

An embodiment of the present invention will now be described with reference to the accompanying drawings. FIG. 1 shows an apparatus for driving a 1K-bit EEPROM. Reference numeral 1 denotes a memory cell array consisting of thin-film transistor cells of, for example, $32 \times 32 = 1024$ bits.

Figure 2:
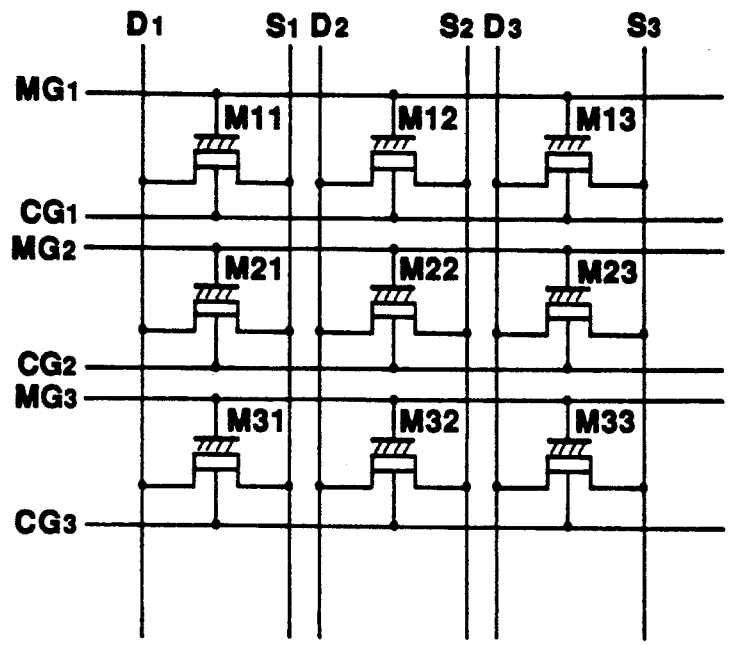

FIG. 2 shows a structure of the memory array 1. For the purpose of convenience, nine memory elements (thin-film transistor cells) M11, M12, ..., M33, which are arranged in a matrix (three rows, three columns), are shown. As will be described in detail, each memory element (e.g. M11) comprises a drain electrode, a source electrode, a memory gate electrode (write/erase electrode), and a control gate electrode (read electrode). Memory gate lines MG1 to MG3 and control gate lines CG1 to CG3 are connected to the memory elements M11, M12 ... M33 as word lines extending in the row direction of the matrix, and drain lines D1 to D3 and source lines S1 to S3 are connected to the memory elements as data lines extending in the column direction of the matrix. The memory gate electrodes and control gate electrodes of the memory elements M11, M12 ... M33 are connected to the memory gate lines MG1 to MG3 and control gate lines CG1 to CG3 in units of a row, and the drain electrodes and source electrodes are connected to the drain lines D1 to D3 and source lines S1 to S3 in units of a column.

Figure 3:
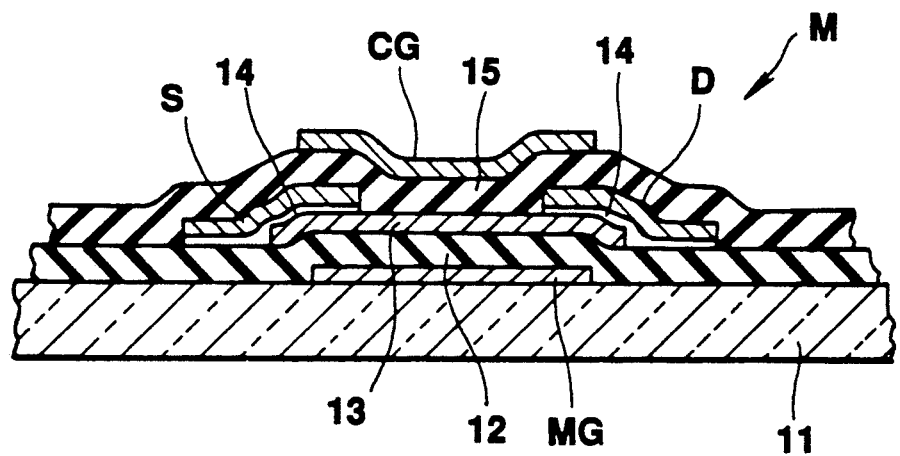

Each memory element (e.g. M11) has a structure as shown in FIG. 3. In FIG. 3, reference numeral 11 denotes an insulative substrate made of glass, etc. A write/erase memory gate electrode MG is formed on the substrate 11. A first gate insulative layer 12 is formed substantially all over the memory gate electrode MG and insulative substrate 11. The first gate insulative layer 12 is an SiN layer having a charge accumulating function and having a composition ratio of Si/N=0.85 to 1.1. A semiconductor layer 13, made of i-type a-Si (amorphous silicon), is formed on the first gate insulative layer 12 above the memory gate MG. Source and drain electrodes S and D are formed over the semiconductor layer 13, with n+-a-Si layers 14 interposed. The source and drain electrodes S and D, the semiconductor layer 13, the first gate insulative layer 12 having the charge accumulating function, and the memory gate electrode MG constitute an inverted-stagger thin-film transistor. A second gate insulative layer 15 is formed over the semiconductor layer 13 and source and drain electrodes S and D connected to the semiconductor layer 13, above the substantially entire surface of the insulative substrate 11. A control gate electrode CG is formed on the second gate insulative layer 15 so as to be opposed to the semiconductor layer 13. The second gate insulative layer 15 is an insulative layer having no charge accumulating function. For example, the layer 15 is an SiN layer having a stoichiometric composition ratio of Si/N=0.75 or thereabouts. The drain electrodes D of these transistors are connected to the drain lines D1 to D3, the sources electrodes S are connected to the source lines S1 to S3, the memory gate electrodes MG are connected to the memory gate lines MG1 to MG3, and the control gate electrodes CG are connected to the control gate lines CG1 to CG3.

The memory gate electrode MG having the charge accumulating function, which is opposed to the semiconductor layer 13 with the first gate insulative layer 12 interposed, serves as a write/erase electrode. The control gate CG having no charge accumulating function, which is opposed to the semiconductor layer 13 with the second gate insulative layer 15 interposed, serves as a read electrode.

In other words, the memory element M comprising the thin-film transistor is constituted by providing the control gate CG on the thin-film transistor having the memory effect. This thin-film transistor comprises the memory gate electrode MG, the first gate insulative layer 12 with the charge accumulating function, the semiconductor layer 13 and the source and drain electrodes S and D. The control gate CG is opposed to the semiconductor layer 13 with the second gate insulative layer 15 having no charge accumulating function interposed. The write/erase operation is performed by using the memory gate MG of the thin-film transistor which is opposed to the semiconductor layer 13 with the first gate insulative layer 12 having the charge accumulating function interposed. The read operation is performed by using the control gate which is opposed to the semiconductor layer 13 with the second gate insulative layer 15 having no charge accumulating function interposed.

Figure 4:
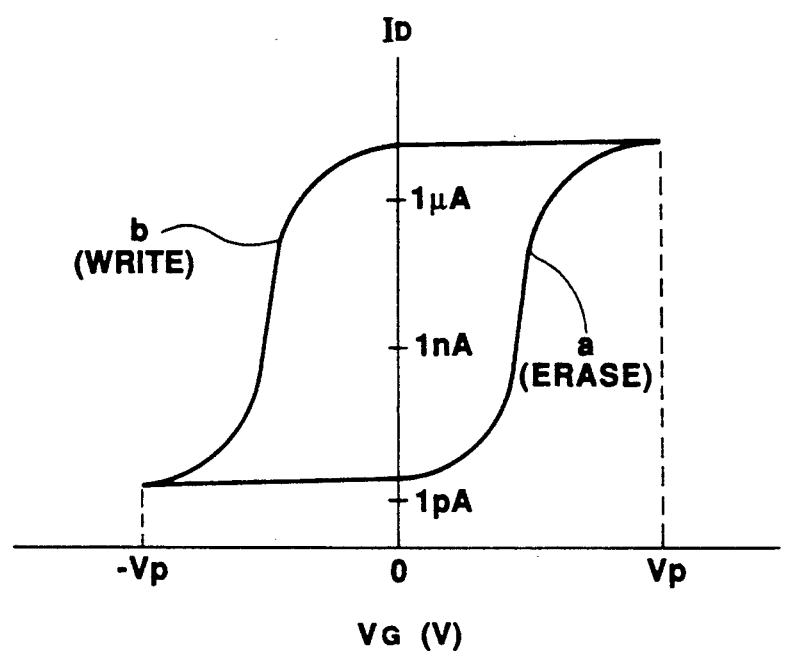

The method of driving the above-described thin-film transistor memory will now be described. As is shown in FIG. 4, the memory element M has a hysteretic characteristic between the gate voltage VG and drain current ID (current flowing across the source and drain).

In this embodiment, stored data is erased by making use of the enhancement-type characteristic portion of the characteristic curve a in the VG-ID characteristic of the memory element M. Data is written by making use of the depletion-type characteristic portion of the characteristic curve b.

Figures 5A, 5B, 5C, 5D, 5E, 6A, 6B, 6C, 6D, 6E, 6F, 6G:
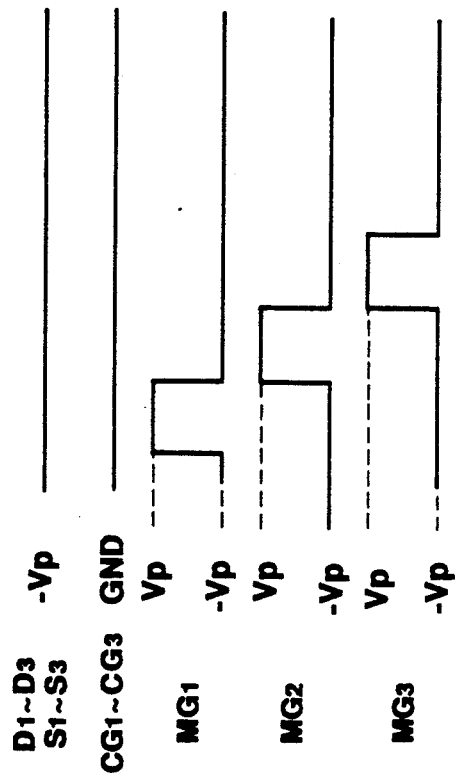
FIGS. 5A to 5E are timing charts showing driving voltage waveforms in the data erase mode in FIG. 2.
FIGS. 6A to 6G are timing charts showing driving voltage waveforms in the data write mode in FIG. 2.

FIGS. 5A to 5E are timing charts showing the relationship in driving voltage, when data stored in the memory elements M11, M12 ... M33 in units of memory gate lines MG1 to MG3. The control gate lines CG1 to CG3 are kept at a predetermined DC level, for example, a ground (GND) level. A voltage of, e.g. 2Vp, is applied between the drain lines D1 to D3 and source lines S1 to S3, on one hand, and the memory gate lines MG1 to MG3, on the other. This voltage is determined such that the memory gate lines MG1 to MG3 are positive (+). Thus, the data is erased. In this case, positive and negative voltages, determined with respect to the GND level or the center level, are applied across the drain/source lines and the memory gate lines, thereby applying an erasure voltage having a relative value of 2Vp. For example, a voltage −Vp is applied to all drain lines D1 to D3 and source lines S1 to S3, and pulse signals "−Vp→Vp" are applied to the memory gate lines MG1 to MG3, as shown in FIGS. 5C to 5E. Thereby, the voltage of relative value 2Vp is applied across the drain lines D1 to D3 and source lines S1 to S3 and the memory gate lines MG1 to MG3, thereby effecting the erasure operation. Since the non-selected memory gate MG, like the source/drain line, is supplied with voltage −Vp, the erasure operation is not carried out on the memory elements connected to the non-selected memory gate lines MG.

FIGS. 6A to 6G are timing charts showing the relationship in driving voltage, when data is written in the memory elements M11, M12 ... M33 in units of one bit. The control gate lines CG1 to CG3 are kept at a predetermined DC level, for example, a ground (GND) level. A voltage of, e.g. −2Vp, is applied between the drain lines D1 to D3 and source lines S1 to S3, on one hand, and the memory gate lines MG1 to MG3, on the other. This voltage is determined such that the memory gate lines MG1 to MG3 are negative (−). Thus, the data is written. In this case, positive and negative voltages, determined with respect to the GND level or the center level, are applied across the drain/source lines and the memory gate lines, thereby applying a write voltage having a relative value of −2Vp. For example, pulse signals "GND→Vp" are successively applied to the drain lines D1 to D3 and source lines S1 to S3, as shown in FIGS. 6A to 6C, and pulse signals "GND→−Vp" are successively applied to the memory gate lines MG1 to MG3, as shown in FIGS. 6E to 6G. In this case, the control gate lines CG1 to CG3 are set at the GND level, as shown in FIG. 6D.

Thereby, the voltage of 2Vp, which is negative on the side of the memory gate lines MG1 to MG3, is selectively applied across the drain lines D1 to D3 and source lines S1 to S3 and the memory gate lines MG1 to MG3, thereby effecting the write operation. For example, when the write voltage of +Vp is applied to the drain/source lines D1 and S1 in the state wherein the memory gate line MG1 is selected, the voltage of relative value −2Vp is applied across the memory gate electrode and drain/source electrodes of the memory element M11. Thus, data write is effected. In this case, since the drain lines D2 and D3 and source lines S2 and S3 are at the GND level, the voltage of −Vp is applied to the memory gates of the memory devices M12 and M13, and the data write is not carried out ("write prevention state").

Besides, the memory gates of the memory elements M21 and M31 are supplied with the voltage of relative value −Vp since the memory gate lines MG2 and MG3 are at the GND level. Thus, the memory gates are in the write prevention state.

Further, the memory elements M22, M23, M32 and M33 are held in the non-selected state, since all the drain lines D2 and D3, source lines S2 and S3 and memory gate lines MG2 and MG3 are at the GND level.

As has been described above, data is written in the memory elements M11, M12 ... M33 in units of one bit, without adversely affecting the other memory elements.

FIGS. 7A to 7E are timing charts showing the relationship in driving voltage when data stored in the memory elements M11, M12 ... M33 is read out. The data read-out is carried out in units of the control gate lines CG1 to CG3. All source lines S1 to S3 and memory gate lines MG1 to MG3 are kept at the GND level. All drain lines D1 to D3 are set at read-out voltage Vi, and control gate lines CG1 to CG3 are supplied with read-out voltages, e.g. pulse voltages "−Vp→GND," at different time points, as shown in FIGS. 7C to 7E. Thus, the data stored in the memory elements M11, M12 ... M33 connected to the control gate lines CG1 to CG3, which are supplied with the read-out pulses, is read out through the drain lines D1 to D3.

At the time of actually inputting data in the above memory elements, all-out erasure is effected and then necessary data is input and written.

In the above embodiment, the erasure was effected by making use of the enhancement-type characteristic, and the write is effected by making use of the depletion-type characteristic; however, this invention can be worked even if memory elements having reverse characteristics are used. In this case, the polarities of the voltages to be applied to the electrodes of the memory elements are set reversely to those of the driving voltages shown in FIGS. 5A to 5E and FIGS. 7A to 7E, thereby effecting data write and data erasure.

In the above embodiment, data erasure is effected in units of a gate line, or data in all memory elements is erased at a time; on the other hand, data write is effected in units of one bit. However, it is possible to carry out data write in units of a gate line or in all memory elements at a time, while carrying out data erasure in units of one bit.

In FIG. 1, the write/read/erasure mode and addresses of the memory array 1 are designated by control signals from a controller 2. Address signals and data signals from external circuits are supplied to the controller 2 and I/0 buffer 5. A 5-bit address code from the controller 2 is decoded by a row decoder 3 and converted to 32-bit address data, thus determining a word line. The 32-bit address data is set in a 32-stage structure buffer 4. An output from the buffer 4 is supplied to the memory array 1 as a row address, and word lines (memory gate lines MG1 to MG3, control gate lines CG1 to CG3) are supplied with signals.

Figures 8, 9:
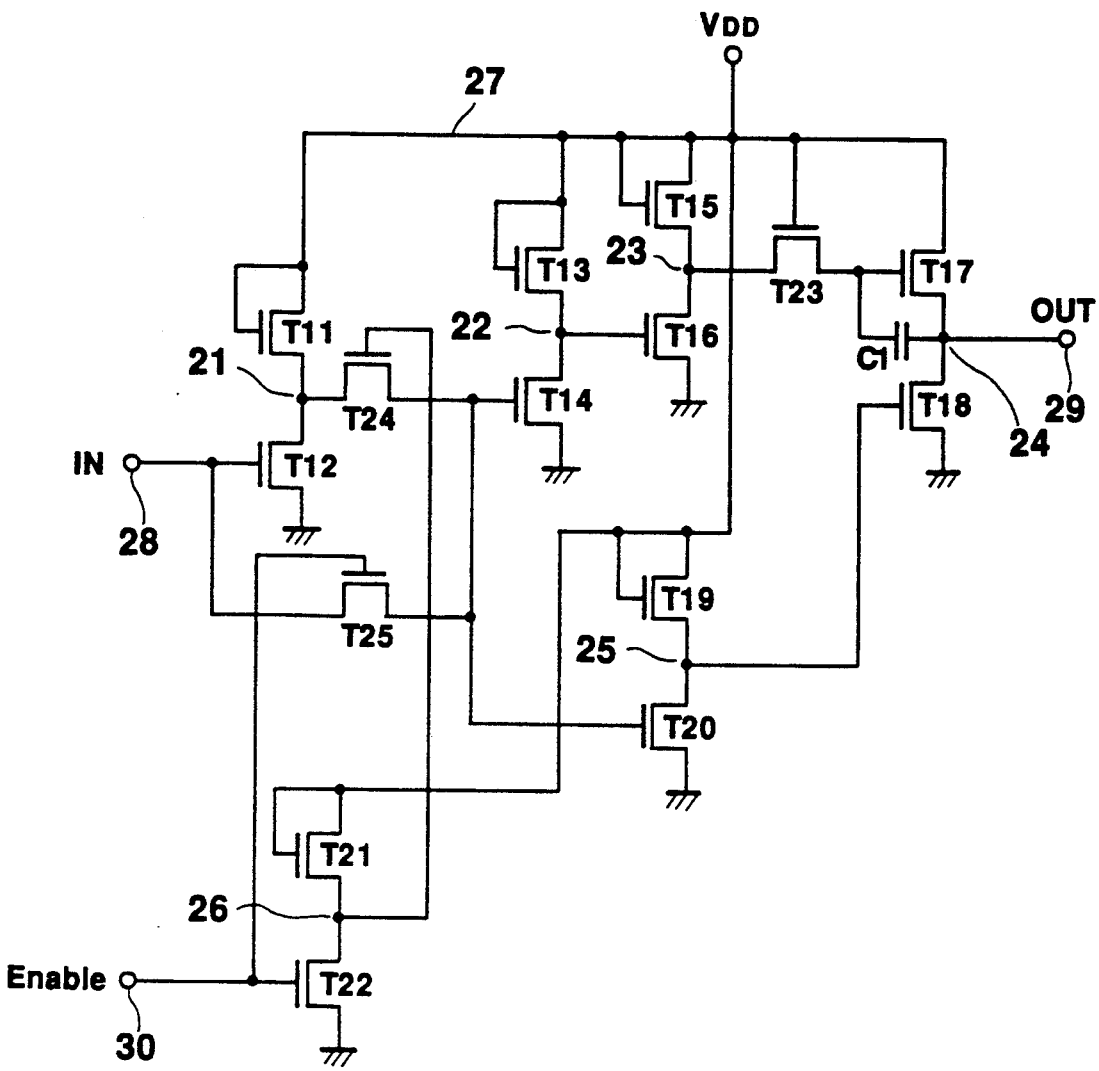

FIG. 8 shows a circuit structure of one stage of the buffer 4 shown in FIG. 1. The buffer 4 shown in FIG. 1 comprises 32 stages. Specifically, one stage of the buffer 4 comprises an inverter circuit 21 constituted by thin-film transistors T11 and T12, an inverter circuit 22 constituted by thin-film transistors T13 and T14, an inverter circuit 23 constituted by thin-film transistors T15 and T16, an inverter circuit 24 constituted by thin-film transistors T17 and T18, an inverter circuit 25 constituted by thin-film transistors T19 and T20 an inverter circuit 26 constituted by thin-film transistors T21 and T22, thin-film transistors T23, T24 and T25, and a capacitor C1.

In the inverter circuit 21, the thin-film transistors T11 and T12 are connected in series. The drain electrode and gate electrode of the thin-film transistor T11 are connected to a power line 27. The source electrode of the transistor T12 is grounded. An input signal IN is input from an input terminal 28 to the gate electrode of the transistor T12. A voltage VDD is applied to the power line 27. A signal derived from a node between the source electrode of the thin-film transistor T11 and the drain electrode of the thin-film transistor T12 is supplied through the thin-film transistor T24 to the gate electrode of transistor T14 of the inverter circuit 22 and also to the gate electrode of transistor T20 of the inverter circuit 25.

The inverter circuit 22, like the inverter circuit 21, is constituted by the thin-film transistors T13 and T14. A signal derived from a node between the source of the transistor T13 and the drain of the transistor T14 is supplied to the gate electrode of the thin-film transistor T16 of the inverter circuit 23.

The inverter circuit 23, like the inverter circuit 21, is constituted by the thin-film transistors T15 and T16. A signal derived from a node between the source electrode of the transistor T15 and the drain electrode of the transistor T16 is input to the drain electrode of the thin-film transistor T23 which constitutes a booster circuit. The gate electrode of the transistor T23 is connected to the power line 27, and the source electrode thereof is connected to the gate electrode of the thin-film transistor T17 of the inverter circuit 24 and also to a node between the source electrode of the transistor T17 and the drain electrode of the transistor T18 through the capacitor C1. The drain electrode of the thin-film transistor T17 is connected to the power line 27, and the source electrode of the thin-film transistor T18 is grounded. The node between the source electrode of transistor T17 and the drain electrode of transistor T18 is connected to an output terminal 29. A signal output from the output terminal 29 becomes an output signal OUT from the buffer amplifier. The input terminal 28 is connected through the thin-film transistor T25 to the gate electrode of the transistor T14 of the inverter circuit 22 and to the gate electrode of the transistor T20 of the inverter circuit 25. The gate electrode of the transistor T25 is supplied with an enable signal through a terminal 30. The enable signal is also input to the gate electrode of the thin-film transistor T22 of the inverter circuit 26. The inverter circuit 26 is constituted similarly with the inverter circuit 21. The connection node between the thin-film transistors T21 and T22 is connected to the gate electrode of the thin-film transistor T24. The inverter circuit 25 is constituted similarly with the inverter circuit 21. A node between the thin-film transistors T19 and T20 is connected to the gate electrode of the thin-film transistor T18 of the inverter circuit 24.

Referring now to FIG. 9, the operation of the buffer 4 will be described. The input terminal 28 receives an input signal IN from the row decoder 3, and the terminal 30 receives an enable signal from the controller 2. The output terminal 29 outputs the output signal OUT to the memory array 1. When the enable signal input from the controller 2 to the terminal 30 is "0" or at a low level, the thin-film transistor T25 is turned off and also the thin-film transistor T22 of the inverter circuit 26 is turned off. When the transistor T22 of inverter circuit 26 is turned off, the value of the output at the node between the transistors T21 and T22 is "1" or at a high level and the thin-film transistor T24 is turned on. In this state, if the input signal IN="0" (or low level) is input from the row decoder 3 to the input terminal 28, the thin-film transistor T12 is turned off and the value of the output at the node between the transistors T11 and T12 becomes "1" (=high level). The high-level signal is supplied through the transistor T24 to the transistors T14 and T20, thereby turning on the transistors T14 and T20. When the transistor T14 is turned on, the output at the node between the transistors T13 and T14 becomes "0" (=low level) and the transistor T16 is turned off. When the transistor T16 is turned off, the output at the node between the transistors T15 and T16 becomes "1" (=high level). Thus, the capacitor Cl is charged through the transistor T23 and the transistor T17 is turned on. Simultaneously, when the transistor T20 is turned on, the output at the node between the transistors T19 and T20 becomes "0" (=low level) and the transistor T18 is turned off. When the transistor T17 is turned on and the transistor T18 is turned off, the output signal OUT having the value "1" (=high level) is output from the terminal 29 to the memory array 1.

When the enable signal input from the controller 2 to the terminal 30 is "0" or at a low level, the thin-film transistor T25 is turned off and also the thin-film transistor T22 of the inverter circuit 26 is turned off. When the transistor T22 of inverter circuit 26 is turned off, the value of the output at the node between the transistors T21 and T22 is "1" or at a high level and the thin-film transistor T24 is turned on. In this state, if the input signal IN ="1" (=high level) is input from the row decoder 3 to the input terminal 28, the thin-film transistor T12 is turned on and the value of the output at the node between the transistors T11 and T12 becomes "0" (=low level). The low-level signal is supplied through the transistor T24 to the transistors T14 and T20, thereby turning off the transistors T14 and T20. When the transistor T14 is turned off, the output at the node between the transistors T13 and T14 becomes "1" (=high level) and the transistor T16 is turned on. When the transistor T16 is turned on, the output at the node between the transistors T15 and T16 becomes "0" (=low level). Thus, the transistor T17 is turned off through the transistor T23. Simultaneously, when the transistor T20 is turned off, the output at the node between the transistors T19 and T20 becomes "1" (=high level) and the transistor T18 is turned on. When the transistor T18 is turned on, the output signal OUT having the value "0" (=low level) is output from the terminal 29 to the memory array 1.

When the enable signal input from the controller 2 to the terminal 30 is "1" (=high level), the transistor T25 is turned on and also the thin-film transistor T22 of the inverter circuit 26 is turned on. When the transistor T22 of inverter circuit 26 is turned on, the output at the node between the transistors T21 and T22 is "0" (=low level) and the thin-film transistor T24 is turned on. In this state, if the input signal IN="0" (or low level) is input from the row decoder 3 to the input terminal 28, the transistors T14 and T20 are turned off by the signal from the transistor T25. When the transistor T14 is turned off, the output at the node between the transistors T13 and T14 becomes "1" (=high level) and the transistor T16 is turned on. When the transistor T16 is turned on, the output at the node between the transistors T15 and T16 becomes "0" (=low level). Thus, the transistor T17 is turned off by the signal from the transistor T23. Simultaneously, when the transistor T20 is turned off, the output at the node between the transistors T19 and T20 becomes "1" (=high level) and the transistor T18 is turned on. When the transistor T18 is turned on, the output signal OUT having the value "0" (=low level) is output from the terminal 29 to the memory array 1.

When the enable signal input from the controller 2 to the terminal 30 is "1" (=high level), the transistor T25 is turned on and also the thin-film transistor T22 of the inverter circuit 26 is turned on. When the transistor T22 of inverter circuit 26 is turned on, the output at the node between the transistors T21 and T22 is "0" (=low level) and the thin-film transistor T24 is turned on. In this state, if the input signal IN="1" (=high level) is input from the row decoder 3 to the input terminal 28, the transistors T14 and T20 are turned on by the signal from the transistor T25. When the transistor T14 is turned on, the output at the node between the transistors T13 and T14 becomes "0" (=low level) and the transistor T16 is turned off. When the transistor T16 is turned off, the output at the node between the transistors T15 and T16 becomes "1" (=high level). Thus, the capacitor Cl is charged and the transistor T17 is turned on by the signal from the transistor T23. Simultaneously, when the transistor T20 is turned on, the output at the node between the transistors T19 and T20 becomes "0" (=low level) and the transistor T18 is turned off. When the transistor T17 is turned on and the transistor T18 is turned off, the output signal OUT having the value "1" (=high level) is output from the terminal 29 to the memory array 1.

In FIG. 1, the column addresses of the 32 columns in the memory array 1 are designated simultaneously. The write data input from the external circuit to the I/0 buffer 5 is supplied to a column switch 6. From the column switch 6, the write data is set in a latch circuit 7 in four units of 8 bits (=32 bits in total). The latch circuit 7 is provided with 64 bits (32 bits×2). Specifically, the controller 2 outputs a 2-bit column designation code to a column decoder 8. The column decoder 8 generates 4-bit column designation data. On the basis of the 4-bit column designation data, the column switch 6 determines to which columns in the latch circuit 7 having the 32-stage structure 8 bits×4 columns) the 8-bit data fed from the I/0 buffer 5 should be assigned.

Figure 19:
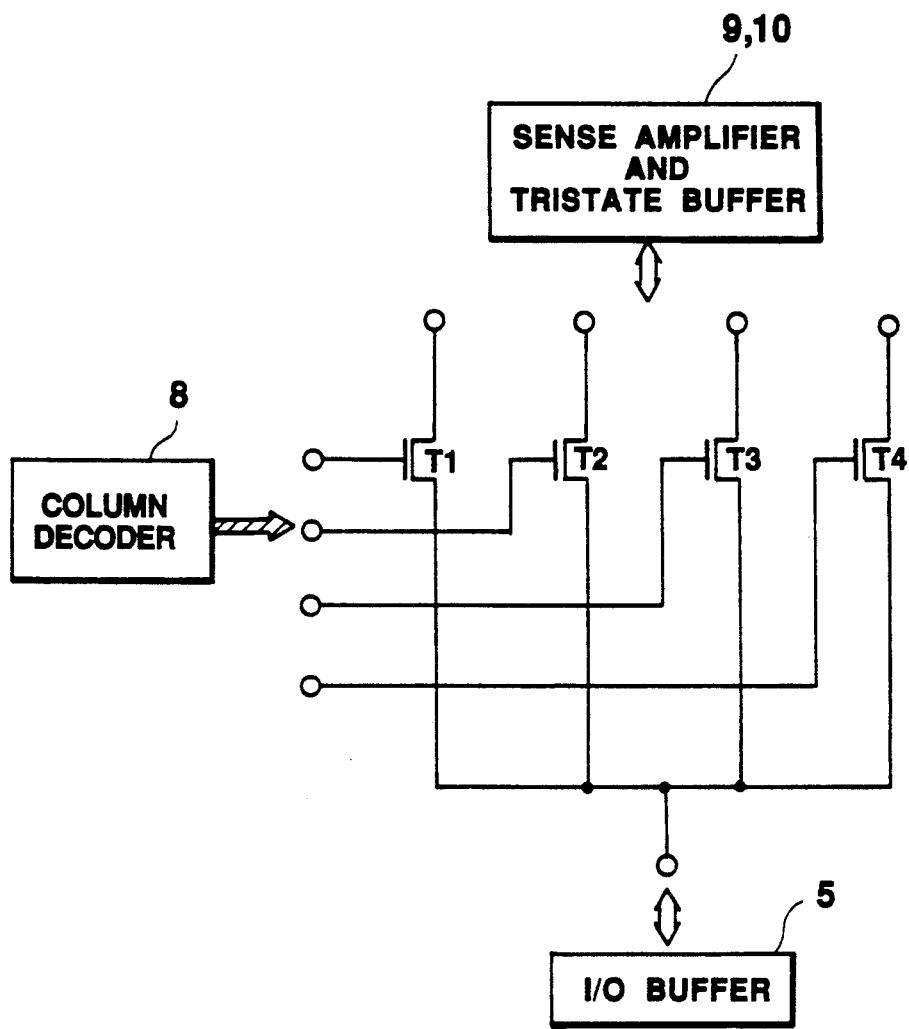

FIG. 19 shows the column switch 6 of FIG. 1 which has 8 bits in each of 4 channels (ch). The switch 6 is a so-called multiplexer in which four data lines connected to switching thin-film transistors T1, T2, T3 and T4 are connected in parallel. One of the transistors T1, T2, T3 and T4 is turned on by the column designation data from the column decoder 8 and one of the four data lines is selected and connected to the I/0 buffer 5 and to a tristate buffer 9 a sense amplifier 10.

Figures 10, 11:
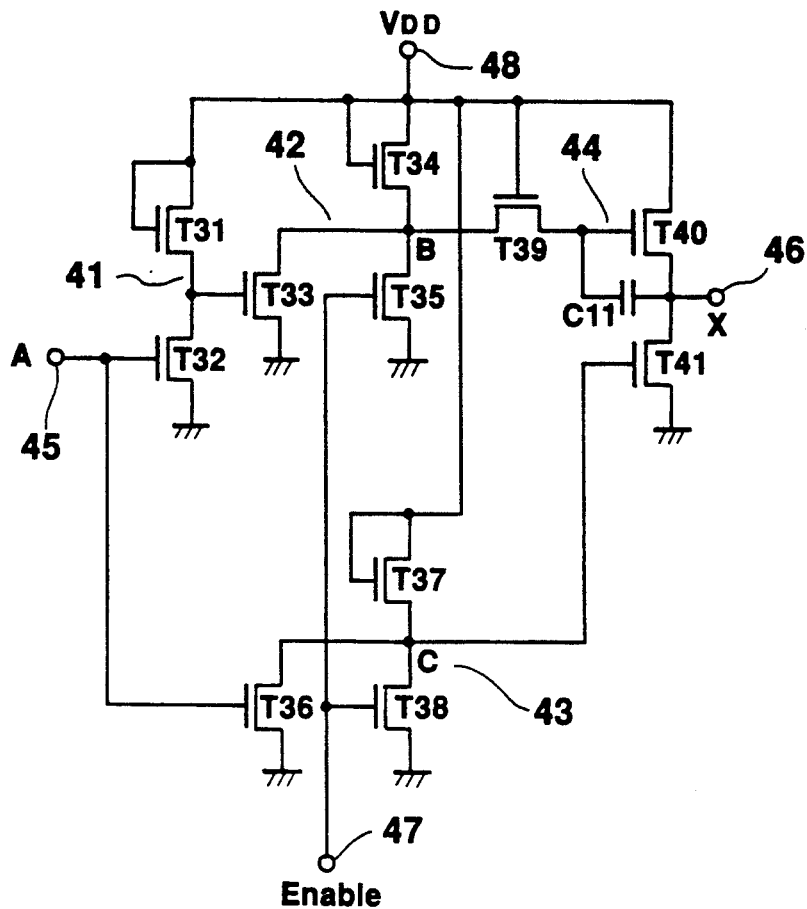

FIG. 10 shows a circuit structure of a one-bit portion of the tristate buffer 9 shown in FIG. 1. The tristate buffer 9 of FIG. 1 has a 32-bit construction. Specifically, the buffer 9 comprises an inverter circuit 41 constituted by thin-film transistors T31 and T32, a thin-film transistor T33, a two-input NOR circuit 42 constituted by thin-film transistors T34 and T35, a thin-film transistor T36, a two-input NOR circuit 43 constituted by thin-film transistors T37 and T38, a thin-film transistor T39, and a bootstrap circuit 44 constituted by a thin-film transistor T40, a thin-film transistor T41 and a capacitor C11. An input terminal 45 receives an input signal A from the latch circuit 7, and an output terminal 46 outputs an output signal X to the memory array 1. A terminal 47 receives an enable signal from the controller 2, and a terminal 48 is supplied with a power source voltage VDD.

FIG. 11 is a view for explaining the operation of the tristate buffer 9. When an input signal A=0 (=low level) is input from the latch circuit 7 to the input terminal 45, the transistor T32 is turned off and the transistor T36 is also turned off. When the transistor T32 is turned off, the output from the inverter circuit 41 becomes "1" (=high level) and the transistor T33 is turned on. In this state, if an enable signal having value "0" (=low level) is input from the controller 2 to the terminal 47, the transistors T35 and T38 are turned off. When the transistor T3 is turned on, the level of the output at a node B from the two-input NOR circuit 42 becomes "0" (=low level), and the transistor T40 is turned off. When the transistors T36 and T38 are turned off, the level of the output at a node C from the two-input NOR circuit 43 becomes "1" (=high level) and the transistor T41 is turned on. When the transistor T41 is turned on, the output signal X having value "0" (=low level) is output through the terminal 46 from the bootstrap circuit 44 to the memory array 1.

When an input signal A=1 (=high level) is input from the latch circuit 7 to the input terminal 45, the transistor T32 is turned on and the transistor T36 is also turned on. When the transistor T32 is turned on, the output from the inverter circuit 41 becomes "0" (=low level) and the transistor T33 is turned off. In this state, if an enable signal having value "0" (=low level) is input from the controller 2 to the terminal 47, the transistors T35 and T38 are turned off. When the transistor T36 is turned on, the level of the output at the node C from the two-input NOR circuit 43 becomes "0" (=low level), and the transistor T41 is turned off. When the transistors T33 and T35 are turned off, the level of the output at the node B from the two-input NOR circuit 42 becomes "1" (=high level) and the transistor T40 is turned on. When the transistor T40 is turned on and the transistor 41 is turned off, the output signal X having value "1" (=high level) is output through the terminal 46 from the bootstrap circuit 44 to the memory array 1. In this case, by the addition of the thin-film transistor T39 and capacitor 11, the boosting operation is possible. The boosting operation is carried out when the potential at node B is raised from "0" to "1" and the potential at node C is changed from "1" to "0." Specifically, the capacitor C11 is charged by the transistor T39 and at the same time the transistor T41 is set to the off-state. Thus, the terminal voltage of the capacitor C11 is superimposed on the potential of the output terminal 46, and the input gate voltage of the transistor T40 is boosted. The resultant voltage is about 2 VDD. Thus, the current driving performance of the transistor T40 can be increased.

When an input signal A=0 (=low level) is input from the latch circuit 7 to the input terminal 45, the transistor T32 is turned off and the transistor T36 is also turned off. When the transistor T32 is turned off, the output from the inverter circuit 41 becomes "1" (=high level) and the transistor T33 is turned on. In this state, if an enable signal having value "1" (=high level) is input from the controller 2 to the terminal 47, the transistors T35 and T38 are turned on. When the transistor T33 is turned on, the level of the output at the node B from the two-input NOR circuit 42 becomes "0" (=low level), and the transistor T40 is turned off. When the transistor T38 is turned on, the level of the output at the node C from the two-input NOR circuit 43 becomes "0" (=low level) and the transistor T41 is turned off. When the transistor T40 and transistor T41 are turned off, the output signal X having value "H·Z" (=high impedance) is output through the terminal 46 from the bootstrap circuit 44 to the memory array 1.

When an input signal A=1 (=high level) is input from the latch circuit 7 to the input terminal 45, the transistor T32 is turned on and the transistor T36 is also turned on. When the transistor T32 is turned on, the output from the inverter circuit 41 becomes "0" (=low level) and the transistor T33 is turned off. In this state, if an enable signal having value "1" (=high level) is input from the controller 2 to the terminal 47, the transistors T35 and T38 are turned on. When the transistor T35 is turned on, the level of the output at the node B from the two-input NOR circuit 42 becomes "0" (=low level), and the transistor T40 is turned off. When the transistor T38 is turned on, the level of the output at the node C from the two-input NOR circuit 43 becomes "0" (=low level) and the transistor T41 is turned off. When the transistor T40 and transistor T41 are turned off, the output signal X having value "H·Z" (=high impedance) is output through the terminal 46 from the bootstrap circuit 44 to the memory array 1.

As has been described above, the three-value logical circuit ("1," "0," "H·Z") by providing the bootstrap circuit 44 having the boosting function at the final stage to increase the driving performance for capacitive load, and by controlling the input to the bootstrap circuit 44 through the NOR circuits 42 and 43 by means of the enable signals input to the NOR circuits 42 and 43.

Figure 12:
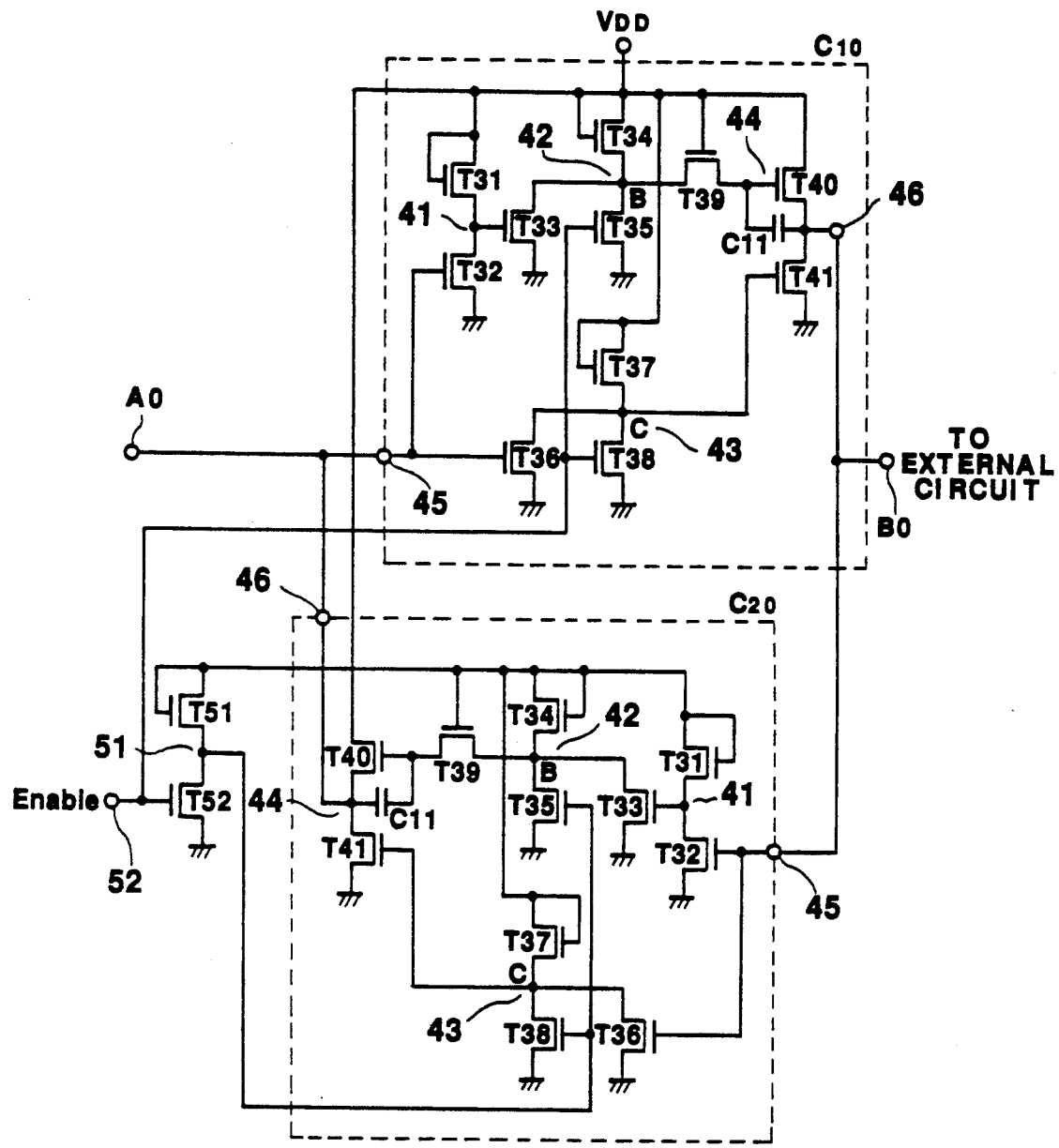

FIG. 12 shows a circuit structure of a one-bit portion of the I/0 buffer shown in FIG. 1. The I/0 buffer 5 of FIG. 1 has an 8-bit construction. Specifically, a first circuit C10 and a second circuit C20 are connected in parallel between a terminal A0 and a terminal B0. The first circuit C10 and second circuit C20 are constructed similarly with the tristate buffer 9 shown in FIG. 10. The input terminal 45 of the tristate buffer 9 is connected to the terminal A0 of the first circuit C10, and the output terminal 46 of the tristate buffer 9 is connected to the terminal B0. The input terminal 45 of the tristate buffer 9 is connected to the terminal B0 of the second circuit C20, and the output terminal 46 of the tristate buffer 9 is connected to the terminal A0. The first circuit C10 is supplied with an enable signal from the controller 2 through a terminal 52, and the second circuit C20 is supplied with an enable signal from the controller 2 through the terminal 52 and an inverter circuit 51 constituted by thin-film transistors T51 and T52. The terminal A0 is connected to the column switch 6 and the terminal B0 is connected to an external circuit.

FIGS. 13 to 15 are views for explaining the operation of the I/0 buffer 5. As shown in FIG. 13, when the enable signal input from the controller 2 through the terminal 52 is "0" (=low level), the enable signal to the first circuit C10 is "0" (=low level) and, as shown in FIG. 11, the first circuit C10 to which the "0" or low-level enable signal is supplied functions as an active circuit. Thus, the terminal A0 functions as an input, and the terminal B0 is functions as an output. In this case, since the enable signal is input to the second circuit C20 through the inverter circuit 51, the enable signal becomes "1" (=high level) and, as shown in FIG. 11, a high-impedance (H·Z) signal is output.

When the enable signal of "1" (=high level) is input from the controller 2 to the terminal 52, the enable signal input to the second circuit C20 is inverted by the inverter circuit 51 to "0" (=low level). Thus, as shown in FIG. 11, the second circuit C20 to which the enable signal of "0" (=low level) is input functions as an active circuit. Accordingly, the terminal B0 functions as an input, and the terminal A0 functions as an output. In this case, since the first circuit C10 receives the enable signal of "1" (=high level), a high-impedance (H·Z) signal is output, as shown in FIG. 11.

FIG. 14 shows the case where the first circuit C10 functions as an active circuit and the enable signal of "0" (=low level) is input from the controller 2 to the terminal 52. In this case, as shown in FIG. 11, the input to the terminal A0 is "0" (=low level) and the output from the terminal B0 is "0" (=low level). In addition, the input to the terminal A0 is "1" (=high level) and the output from the terminal B0 is "1" (=high level).

FIG. 15 shows the case where the second circuit C20 functions as an active circuit and the enable signal of "1" (=high level) is input from the controller 2 to the "1" (=high level) is input from the controller 2 to the terminal 52. In this case, as shown in FIG. 11, the input to the terminal B0 is "0" (=low level) and the output from the terminal A0 is "0" (=low level). In addition, the input to the terminal B0 is "1" (=high level) and the output from the terminal A0 is "1" (=high level).

Figure 16:
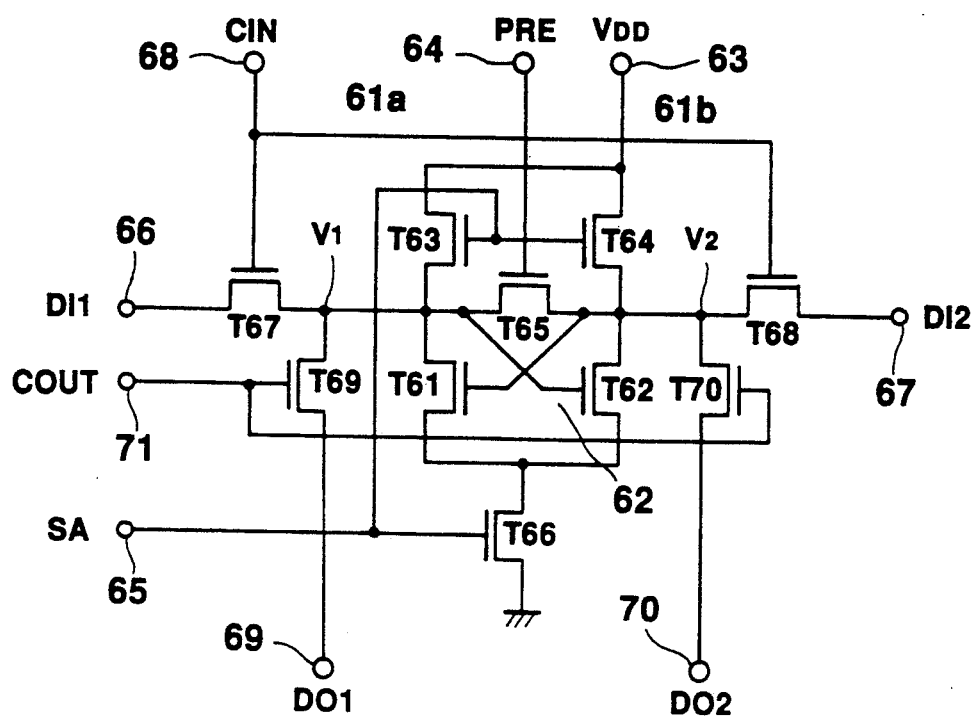

FIG. 16 is a circuit diagram showing a one-bit portion of the sense amplifier 10 shown in FIG. 1. The sense amplifier 10 of FIG. 1 has a 32-bit construction. As shown in FIG. 16, an amplifier 62 is constituted by connecting an inverter circuit 61a comprising thin-film transistors T61 and T62 and an inverter circuit 61b comprising thin-film transistors T62 and T64 in a cross-coupled configuration. A control thin-film transistor T65 is connected at a mid-point between the inverter circuits 61a and 61b, i.e. between the drain electrodes of thin-film transistors T61 and T63 and the drain electrodes of thin-film transistors T62 and T64. A control transistor T66 is connected between the source electrodes of the transistors T61 and T62 and a ground. The source electrodes of the transistors T63 and T64 are supplied with a power source voltage VDD through a terminal 63, and the gate electrode of the transistor T65 is supplied with a precharge signal PRE via a terminal 64. In addition, an operation timing signal SA is applied to the gate electrodes of the transistors T63, T64 and T66 through a terminal 65.

A signal DI1 is supplied to the drain electrodes of the transistors T61 and T63 from the memory array 1 via a terminal 66 and a thin-film transistor T67. A signal DI2 is supplied to the drain electrodes of the transistors T62 and T64 from the memory array 1 via a terminal 67 and a thin-film transistor T68. A signal readout clock pulse CIN is supplied to the gate electrodes of the transistors T67 and T68 via a terminal 68.

An output signal D01 is derived from the drain electrodes of the thin-film transistors T61 and T63 through a thin-film transistor T69 and a terminal 69. The output signal D01 is fed to the latch circuit 7. An output signal D02 is derived from the drain electrodes of the thin-film transistors T62 and T64 through a thin-film transistor T70 and a terminal 70. The output signal D01 is fed to the latch circuit 7. A signal output clock pulse COUT is applied to the gate electrodes of the transistors T69 and T70 via a terminal 71.

Figures 18A, 18B:
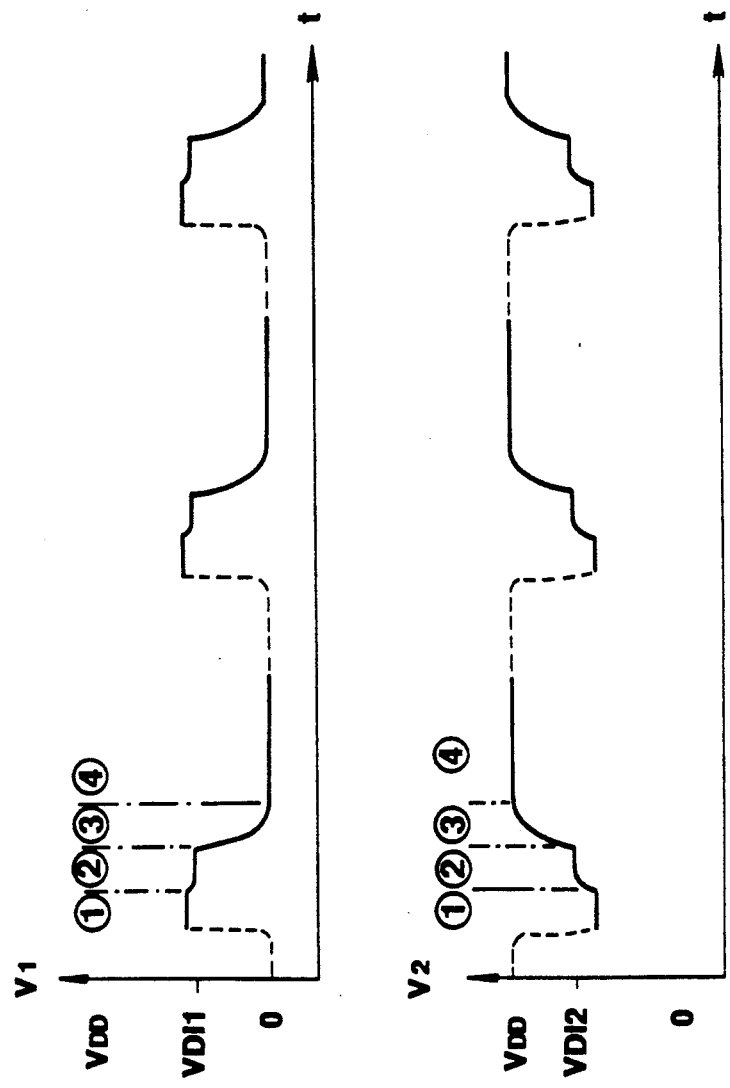
FIGS. 18A and 18B show signal waveforms for explaining the operation of the circuit of FIG. 16.

The operation of the sense amplifier 10 shown in FIG. 16 will now be described with reference to the timing charts of FIGS. 17A to 17E and FIGS. 18A and 18B. FIGS. 17A to 17E show the generation timings of various timing signals PRE, CIN, SA and COUT input to the terminals 64, 68, 65 and 71 of the circuit of FIG. 16, and FIGS. 18A and 18B show the waveforms of signals on both ends of the thin-film transistor T65.

When the logical circuit shown in FIG. 16 is operated, the potentials of the pulse signals CIN, SA and COUT input to the terminals 68, 65 and 71 are set to an "L" level (low level), as shown by 1 in FIG. 17. Only the precharge signal PRE input to the terminal 64 is set to an "H" level (high level). By setting the precharge signal PRE to the "H" level, the transistor T65 is turned on to precharge the inverter circuits 61a and 61b. Thus, as shown in FIGS. 18A and 18B, the potentials V1 and V2 at the opposite ends of the transistor T65 are equalized (①in FIGS. 18A and 18B).

Next, the precharge signal PRE is set to the "L" level and only the clock pulse CIN input to the terminal 68 is set to the "H" level (② in FIG. 17B). At this time, if the potentials of the signals DI1 and DI2 supplied from the memory array 1 to the signal input terminals 66 and 67 are set to DI1 and DI2, the values of potentials V1 and V2 at opposite ends of the transistor T65 are set to VDI1 and VDI2 (② in FIGS. 18A and 18B). In this case, one of the potentials is set higher than the other so as to set up the relationship of VDI1 < VDI2, for example.

Thereafter, the clock pulse CIN is set to the "L" level and the timing signal SA input to the terminal 65 is set to the "H" level (③ in FIG. 17C). When the timing signal SA is set to the "H" level, the transistors T63, T64 and T66 are turned on and the amplifier 12 constituted by the transistors T61, T63, T62 and T64 is rendered operative. The amplifier 12 amplifies V1 to the "L" level and V2 to the "H" level (③ in FIGS. 18A and 18B).

After the amplification operation by the amplifier 62 is surely effected, the clock pulse input to the terminal 71 is set to the "H" level and the output signal from the amplifier 62 is supplied to the outside. Specifically, when the clock pulse COUT is set to the "H" level, the transistors T69 and T70 are turned on and the output signal from the amplifier 62 is supplied to the latch circuit 7 via the transistors T69 and T70 and terminals 69 and 70.

In the above embodiment, the signals VDI1 and VDI2 input to the terminals 66 and 67 are set to establish the relationship of VDI1 < VDI2; however, it is also possible to set up the relationship of VDI1 > VDI2, and in this case, the signal levels of the signals D01 and D02 output from the terminals 69 and 70 are inverted, compared to those obtained in the case shown in FIGS. 18A and 18B.

Referring back to FIG. 1, the write data set in the latch circuit 7 is written in the memory array 1 through the tristate buffer 9 for controlling the ON/OFF of the gates and through the data lines (drain lines D1 to D3 and source lines S1 to S3). The data thus input from the I/0 buffer 5 is fed to the memory cells connected to a predetermined word line in the memory array 1. In this way, the write data set in the latch circuit 7 is written in the memory array 1 via the tristate buffer 9 and simultaneously the setting of the other 32 stages (32 bits) of the latch circuit 7 is started by the next address signal and data signal. Thus, it is possible to set the next write data in the latch circuit during writing current data in the memory array 1. As a result, the time required to write data in the memory array 1 can be decreased to ¼, compared to the prior art. In other words, the apparent write speed is increased four times, and high-speed operations can be performed. This effect is enhanced, where the memory capacity is increased.

On the other hand, the data read out from the data lines (drain lines D1 to D3 and source lines S1 to S3) of the memory array 1 is amplified by the sense amplifier 10. Regarding the sense amplifier 10, 32 sense amplifiers are actually juxtaposed in accordance with the number of output data lines of the memory array 1. The 32-stage (32-bit) data amplified by the sense amplifier 10 is set in the latch circuit 7. The 32-stage (32-bit) data set in the latch circuit 7 is divided into four units of 8 bits by the column switch 6 and the units are successively output to the external circuit through the I/0 buffer 5. The 32-stage (32-bit) data set in the latch circuit 7 is output to the external circuit through the column switch 6 and I/0 buffer 5 and, at the same time, the setting of the the next data read out from the memory array 1 in the other 32-stage (32-bit) portion of the latch circuit 7 is started via the sense amplifier 10. Thus, if the 32-stage (32-bit) data set in the latch circuit 7 is divided into four units of 8 bits by the column switch and the units are successively output to the external circuit via the I/0 buffer 5, while alternately setting two units of 32-bit data read out from the memory array 1 in the latch circuit 7, it is possible to set the next readout data in the latch circuit 7 during outputting the data set in the latch circuit 7 to the external circuit. As a result, the time required to read out data from the memory array 1 can be decreased, compared to the prior art. In other words, the apparent read speed is increased, and high-speed operations can be performed. This effect is enhanced, where the memory capacity is increased.

The above-described embodiment is directed to the EEPROM; however, this invention is also applicable to other IC memories such as an EPROM.

What is claimed is:

1. A memory system comprising:
    a memory array having a plurality of word lines, a plurality of data lines, and a plurality of memory elements, each of said memory elements being connected to one of said word lines and one of said data lines;
    word line designating means for designating one of said word lines of said memory array, for effecting data readout from said memory array and wiring of data into said memory array;
    sense amplifier means for discriminating data read out from said memory array;
    latch means for latching data to be written into and read out from said memory array, said latch means having a plurality of latch elements, the number of said latch elements corresponding to the number of memory elements connected to a plurality of word lines of said memory array;
    data supply means for supplying the data to said latch means;
    respective data for connecting said data lines of said memory array to said sense amplifier means, for connecting said sense amplifier means to said latch means, for connecting said latch means to said data line of said memory array, and for connecting said data supply means to said latch means; and
    read/write means including:
    write means for writing the data latched in said latch means into said memory array as a batch, wherein the number of data written into said memory elements at one time corresponds to the number of memory elements connected to one word line; and
    readout means for reading out the data from said memory array to said sense amplifier means and for transferring said data from said sense amplifier means to said latch means as a batch, wherein the number of data transferred to said latch means at one time corresponds to the number of memory elements connected to one word line.

2. The memory system according to claim 1, wherein said sense amplifier means includes:
    a flip-flop circuit having a positive feedback circuit;
    control voltage supplying means for supplying an operation voltage to said flip-flop circuit to set a high-level voltage and a low-level voltage; and
    switching means for outputting said high-level and low-level voltages to the outside of said sense amplifier means.

3. The memory system according to claim 1, wherein each of said memory elements is formed by a thin-film transistor.

4. The memory system according to claim 1, wherein said latch means comprises thin-film transistors.

5. The memory system according to claim 1, wherein said sense amplifier means comprises thin-film transistors.

6. The memory system according to claim 1, wherein the read/write means includes a thin-film transistor.

7. The memory system according to claim 1, wherein said word line designating means includes a thin-film transistor.

8. The memory system according to claim 1, wherein said word line designating means includes a buffer circuit including a booster circuit provided between a final output stage and a preceding-stage circuit, and wherein an output signal from the preceding-stage circuit is boosted and is input to a gate electrode of a transistor in the final output stage.

9. The memory system according to claim 1, wherein said write means includes:
    a NOR circuit to which an enable signal is input; and
    a boostrap circuit having a booster circuit, an input signal to said boostrap circuit being controlled by the NOR circuit to enhance a driving performance relating to a load.

* * * * *